US010212862B2

(12) United States Patent
Agostini et al.

(10) Patent No.: US 10,212,862 B2
(45) Date of Patent: Feb. 19, 2019

(54) COOLING APPARATUS AND METHOD

(71) Applicant: ABB Schweiz AG, Zürich (CH)

(72) Inventors: Bruno Agostini, Zürich (CH); Daniele Torresin, Birmenstorf (CH); Francesco Agostini, Zürich (CH); Gernot Riedel, Baden-Rütihof (CH); Mathieu Habert, Rixheim (FR)

(73) Assignee: ABB Schweiz AG, Baden (CH)

( * ) Notice: Subject to any disclaimer, the term of this patent is extended or adjusted under 35 U.S.C. 154(b) by 40 days.

(21) Appl. No.: 15/195,213

(22) Filed: Jun. 28, 2016

(65) Prior Publication Data

US 2017/0013747 A1    Jan. 12, 2017

(30) Foreign Application Priority Data

Jul. 9, 2015    (EP) .................................... 15176089

(51) Int. Cl.
*H05K 7/20* (2006.01)
*F28D 15/02* (2006.01)
(Continued)

(52) U.S. Cl.
CPC .......... *H05K 7/20936* (2013.01); *B23P 15/26* (2013.01); *F28D 15/0266* (2013.01);
(Continued)

(58) Field of Classification Search
CPC ......... H01L 23/427; H01L 2924/01013; H01L 23/3733; F28D 15/0275; F28D 15/043; F28D 15/04; F28D 2015/0225; F28D 15/0266; F28D 15/046; F28D 2021/0029; G06F 1/203; G06F 1/20; G06F 2200/201; F28F 1/022; F28F 2260/02; F28F 21/084;
(Continued)

(56) References Cited

U.S. PATENT DOCUMENTS 6,360,814 B1 * 3/2002 Tanaka ................ F28D 15/0266
165/104.21
6,396,700 B1 * 5/2002 Chu ........................ H01L 23/34
165/185

(Continued)

FOREIGN PATENT DOCUMENTS

EP    2527776 A1    11/2012

OTHER PUBLICATIONS

European Patent Office, Extended Search Report issued in corresponding Application No. 15176089.9, dated Jan. 25, 2016, 7 pp.

*Primary Examiner* — Adam B Dravininkas
(74) *Attorney, Agent, or Firm* — J. Bruce Schelkopf; Taft Stettinius & Hollister LLP

(57) ABSTRACT

This invention relates to a cooling apparatus comprising a base plate, an evaporator and a condenser. In order to obtain a simple and efficient cooling apparatus the evaporator is a porous aluminum evaporator having a capillary structure with pores and a plurality of larger sized evaporator channels extending through the evaporator between a second end and the first end of the evaporator. A compensation chamber extending along a second surface of the evaporator receives first fluid from the condenser such that pores opening up into the second surface of the evaporator are provided with first fluid.

13 Claims, 4 Drawing Sheets

(51) Int. Cl.
*F28D 15/04* (2006.01)
*F28F 21/08* (2006.01)
*H01L 23/373* (2006.01)
*H01L 23/427* (2006.01)
*B23P 15/26* (2006.01)
*F28D 21/00* (2006.01)

(52) U.S. Cl.
CPC ......... *F28D 15/043* (2013.01); *F28D 15/046* (2013.01); *F28F 21/084* (2013.01); *H01L 23/3733* (2013.01); *H01L 23/427* (2013.01); *H05K 7/20309* (2013.01); *H05K 7/20318* (2013.01); *H05K 7/20336* (2013.01); *F28D 2021/0029* (2013.01)

(58) Field of Classification Search
CPC ........... H05K 7/20336; H05K 7/20936; H05K 7/20309; H05K 7/20318; B23P 15/26
See application file for complete search history.

(56) References Cited

U.S. PATENT DOCUMENTS

| | | | | |
|---|---|---|---|---|
| 6,674,642 B1* | 1/2004 | Chu | ................ | G06F 1/203 |
| | | | | 165/80.4 |
| 7,394,655 B1* | 7/2008 | O'Keeffe | ........... | H05K 7/20363 |
| | | | | 165/104.33 |
| 7,436,059 B1* | 10/2008 | Ouyang | ................ | H01L 23/34 |
| | | | | 257/712 |
| 7,828,046 B2* | 11/2010 | Huang | .................... | B22F 5/106 |
| | | | | 165/104.26 |
| 8,356,410 B2* | 1/2013 | Zhao | .................... | F28D 15/046 |
| | | | | 165/104.26 |
| 8,656,710 B2* | 2/2014 | Bell | ....................... | F01N 3/043 |
| | | | | 165/51 |
| 9,097,467 B2* | 8/2015 | Gradinger | ............... | F28D 15/02 |
| 9,142,476 B2* | 9/2015 | Shioga | .................... | H01L 23/13 |
| 9,333,599 B2* | 5/2016 | de Bock | ................. | B23P 15/26 |
| 2001/0052234 A1* | 12/2001 | Venkatasubramanian | .................... | |
| | | | | F25B 21/02 |
| | | | | 62/3.2 |
| 2004/0206480 A1 | 10/2004 | Maydanik et al. | | |
| 2005/0230085 A1* | 10/2005 | Valenzuela | .......... | F28D 15/0233 |
| | | | | 165/104.26 |
| 2006/0283574 A1* | 12/2006 | Huang | .................. | F28D 15/046 |
| | | | | 165/104.26 |
| 2007/0084587 A1* | 4/2007 | Huang | .................... | B22F 5/106 |
| | | | | 165/104.26 |
| 2007/0187072 A1 | 8/2007 | Chin et al. | | |
| 2007/0267180 A1* | 11/2007 | Asfia | .................... | F28D 15/043 |
| | | | | 165/104.26 |
| 2008/0307651 A1* | 12/2008 | Zhao | .................... | F28D 15/046 |
| | | | | 29/890.032 |
| 2009/0266514 A1* | 10/2009 | Agostini | ............... | H01L 23/427 |
| | | | | 165/80.3 |
| 2010/0089554 A1* | 4/2010 | Lee | .................... | F28D 15/046 |
| | | | | 165/104.26 |
| 2014/0190667 A1* | 7/2014 | McGlen | ................ | F28D 15/046 |
| | | | | 165/104.26 |

* cited by examiner

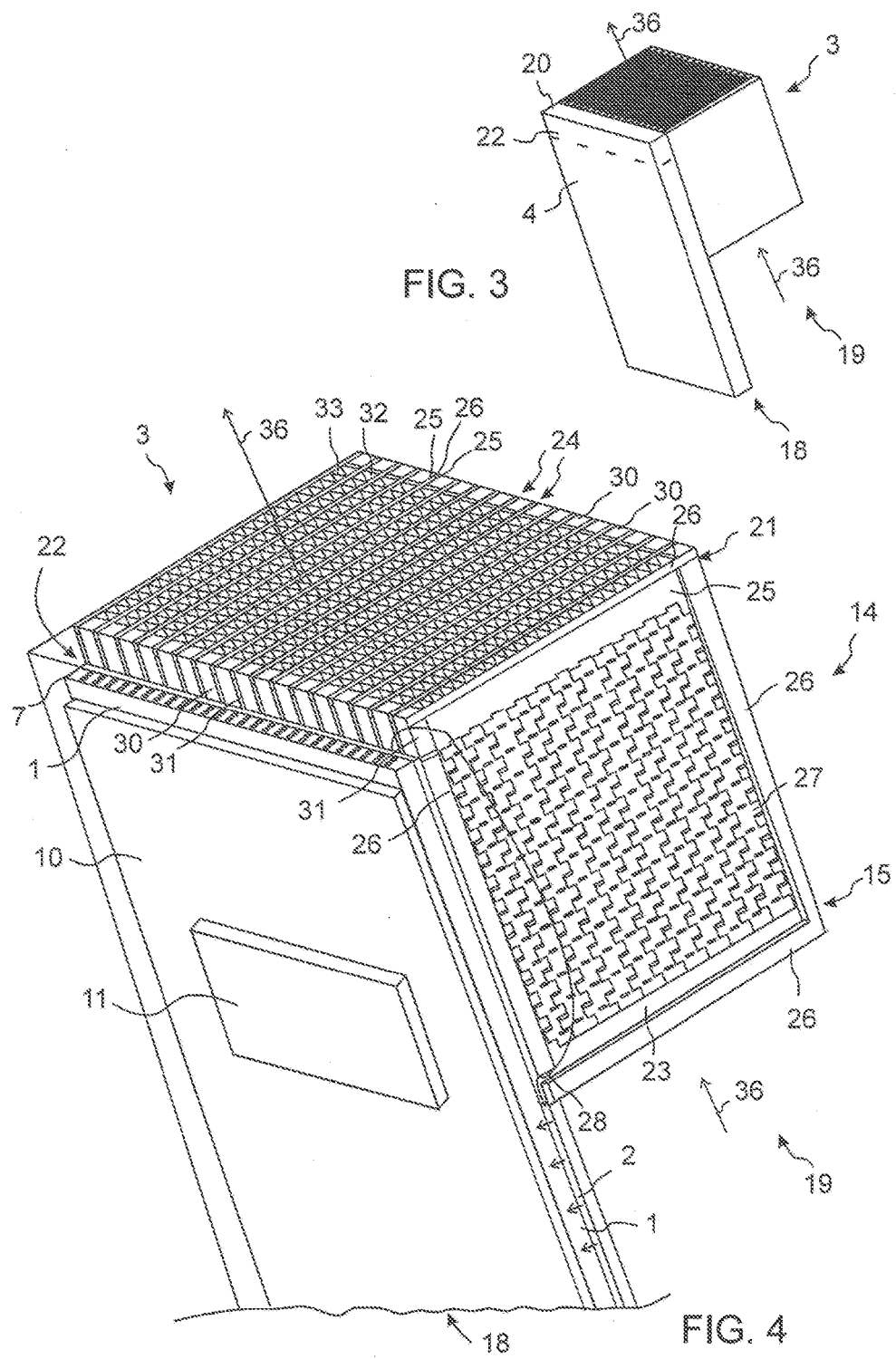

COOLING APPARATUS AND METHOD

BACKGROUND OF THE INVENTION

Field of the Invention

This invention relates to a cooling apparatus and to a method for manufacturing a cooling apparatus.

Description of Prior Art

A trend in electric devices has for a long time been that the size of the devices should be made smaller simultaneously as the devices become more efficient, which leads to devices with a higher power density. One of the problems occurring due to this is to provide sufficient cooling in order to avoid problems due to excessive raise of the operating temperature. Conventional heat sinks dissipating heat into surrounding air are not able to fulfill the requirements in all implementations.

Previously there is known a cooling apparatus comprising an evaporator and condenser. The evaporator receives a heat load into a first fluid and passes on this first fluid to a condenser dissipating the heat load into surroundings.

The properties provided by the above mentioned known apparatus are, however, still not optimal.

SUMMARY OF THE INVENTION

An object of the present invention is to provide a cooling apparatus capable of providing efficient and adequate cooling. This object is achieved with a cooling apparatus according to independent claim 1, a power module according to independent claim 13 and a manufacturing method according to independent claim 14.

The use of an evaporator comprising porous aluminum having a capillary structure with a plurality of capillary pores and a plurality of larger evaporator channels makes it possible to easily obtain a cooling apparatus having excellent cooling properties and which can be advantageously utilized in various implementations. In this connection the term "aluminum" refers not only to pure aluminum but also to various aluminum alloys, An alternative of manufacturing such a cooling apparatus is to utilize 3D printing for the manufacturing of the evaporator or a part of it. In that way an evaporator with an appropriate and efficient structure can be obtained in a cost efficient way.

BRIEF DESCRIPTION OF DRAWINGS

In the following the present invention will be described in closer detail by way of example and with reference to the attached drawings, in which FIGS. 1 to 4 illustrate a first embodiment of a cooling apparatus and of a method for manufacturing a cooling apparatus.

DESCRIPTION OF AT LEAST ONE EMBODIMENT

Figure 1:
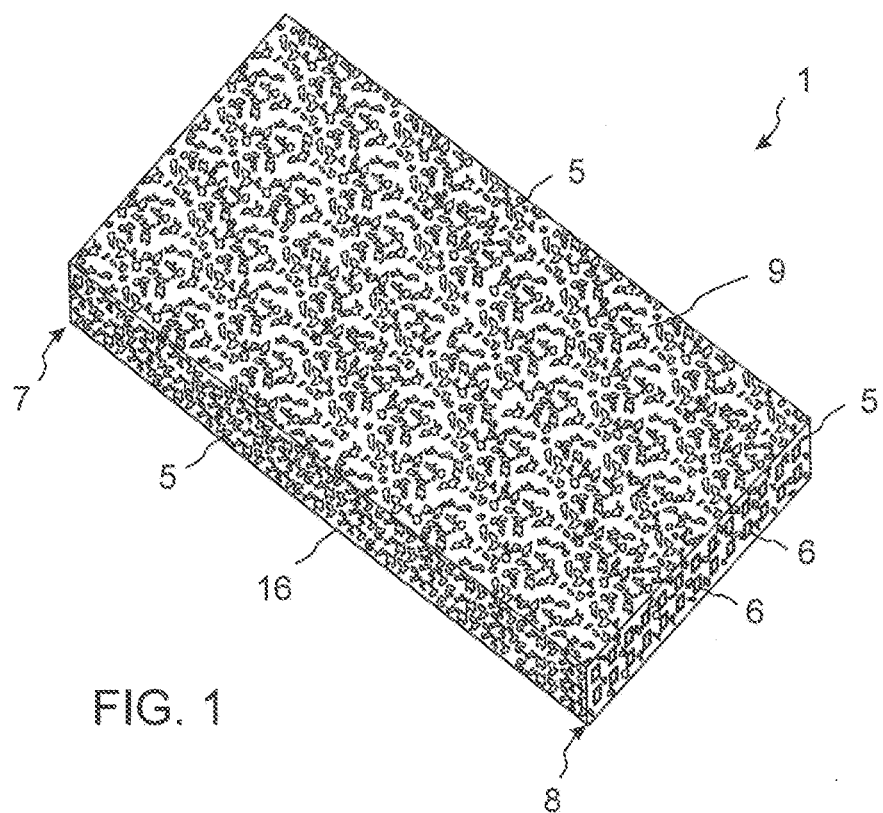
Figure 2:
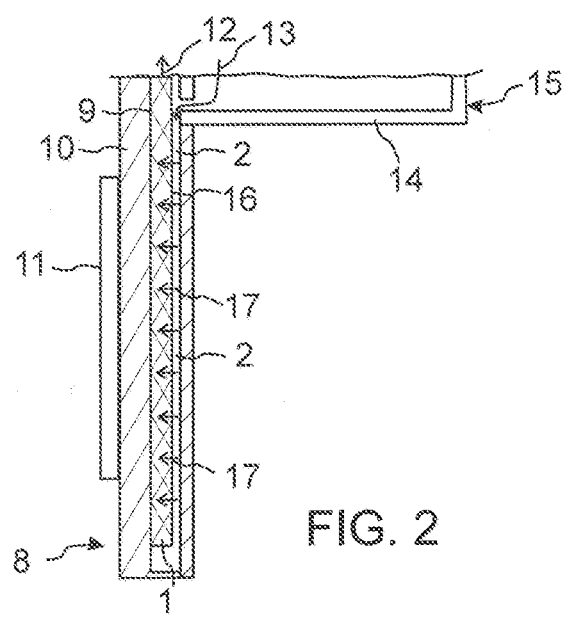

FIGS. 1 to 4 illustrate a first embodiment of a cooling apparatus and of a method for manufacturing a cooling apparatus. In the following explanation it is by way of example assumed that the cooling apparatus is a CLHP (Capillary Loop Heat Pipe) providing cooling by utilizing thin film evaporation. FIG. 1 illustrates the a porous structure of an evaporator 1 which additionally may include other parts. FIG. 2 illustrates use of the evaporator 1 in connection with a compensation chamber 2. FIG. 3 is an outside view of the cooling apparatus 3 and FIG. 4 illustrates details of the cooling apparatus 3 with the housing 4 removed.

The evaporator 1 illustrated in FIG. 1 may be manufactured by utilizing a 3D printer, for instance. One alternative is to 3D print the evaporator 1 of brazable aluminum. This brazable aluminum material may in practice consist of an aluminum alloy, in other words a mix of aluminum with other materials. This makes it possible to obtain a capillary porous structure with micro pores throughout the entire structure of the evaporator 3. Additionally, the evaporator provides a high heat transfer area which makes it able to handle high heat flux densities. In order to ensure that fluid in vapor state can efficiently propagate through the evaporator, the evaporator is provided with evaporator channels 6 extending through the evaporator 1 from a second end 8 of the evaporator 1 to a first end of the evaporator 7. The second end 8 of the evaporator 1 is at the location where fluid can enter the evaporator channels 6 from the lowermost part of the evaporator channel 6, as illustrated in FIG. 2 and the first end of the evaporator is at the location where fluid can exit the evaporator channels 6 from the uppermost part of the evaporator 1, as illustrated in FIG. 4. The evaporator channels 6 have a larger size, such as diameter than the pores 5. Tough the size of the pores is referred to as the pore diameter, this does not mean that the pores necessarily are circular. In practice the shape and size of the single pores in the same evaporator may vary.

From FIG. 1 it can be seen that the evaporator channels 6 are located in a middle part of the illustrated evaporator 1, in other words not in the first surface 9 or in the second surface 16 (as in the evaporator illustrated in FIG. 9), but embedded at a location between the first surface 9 and the second surface 16. The term "embedded" refers to a solution where the evaporator channels 6 are located within the material of the evaporator 1 and do not open up into the first surface 9 or second surface 16 of the evaporator. An advantage with such a solution which can be obtained by 3D printing is that a relatively large first surface 9 remains intact (except for the pores 5) for heat transfer such that heat can efficiently be transferred to the evaporator 7. It is also possible to arrange evaporator channels 6 in several layers. In other words embed them at different depths between the first surface 9 and the second surface 16, as illustrated in FIG. 1. This makes it possible to obtain a relatively large total cross sectional flow area for the evaporator channels 6.

In order to manufacture a cooling apparatus utilizing an evaporator 1 a compensation chamber 2 as illustrated in FIG. 2 may be taken into use. In FIG. 2 the evaporator is arranged with a first surface 9 in thermal contact with a surface of a base plate 10. Once the base plate 10 receives a heat load from one or more electric components 11 the heat load is transferred to first fluid present in the evaporator 1. The heat load vaporizes the first fluid in the wick of the evaporator 1. Driven by the vapor pressure, the first fluid flows as vapor 12 through the straight evaporator channels 6 towards the condenser 14.

Only the second end 15 of the condenser 14 is illustrated in FIG. 2. The second end 15 of the condenser is at the location where fluid can exit the condenser and enter the compensation chamber. In the condenser 14 the first fluid condenses into liquid 13, which enters the compensation chamber 2. The capillary pressure generated by the liquid/vapor interface (meniscus) in the evaporator 1 wick surface provides a pumping force that ensures circulation of the first fluid within the cooling apparatus irrespectively of the orientation in which the cooling apparatus is utilized. Consequently, the cooling apparatus works as an orientation free capillary loop heat pipe. Therefore the cooling apparatus is easy to implement in a product.

The liquid 13 obtained from the second end 15 of the condenser 14 enters the compensation chamber 2. In the compensation chamber 2 capillary forces pump the first fluid in liquid 13 state along a second surface 16 of the evaporator 1. This ensures a permanent wetting of the evaporator 1 areas receiving heat from the base plate 10. Pores 5 opening up into the second surface 16 of the evaporator 1 are thereby provided with first fluid. The fluid entering the pores 5 is moved by capillary forces deeper into the structure of the evaporator 1 in a direction which is generally perpendicular to the direction of the evaporator channels 6, as illustrated by arrows 17. Consequently, the compensation chamber 2 acts as a liquid reservoir ensuring a sufficient supply of first fluid in liquid state to the evaporator 1.

The evaporator 1 illustrated in FIG. 1 and utilized in a cooling apparatus as illustrated in FIG. 2 may be manufactured such that the porosity degree, in other words the size of the pores varies between the first end 7 and the second end 8. This makes it possible to actively steer and control an even and optimal flow through the entire evaporator. One alternative is that the pores are narrower and consequently have a smaller size proximate to the first end 7, i.e. the closer they are to the first end 7 than the size of the pores located proximate to the second end 8, i.e. the closer they are to the second end 8. In this way more resistance is caused for the first fluid at the first end 7 which encourages the first fluid to flow towards the second 8 along the compensation chamber 2. Such a variation in the porosity degree is easy to obtained when the manufacturing is made by 3D printing, as previously explained.

FIG. 3 is an outside view of the cooling apparatus 3. From the shape of the housing 4 illustrated in FIG. 3, it can be seen that the cooling apparatus 3 comprises a first section 18 containing the base plate 10, the electric component 11, the evaporator 1 and the compensation chamber 2. A second section 19 of the cooling apparatus 3 comprises the condenser 14 and flow channels 21 for a second fluid 36. The flow channels 32 allow the second fluid 36, such as air, to flow through the second section 19 of the cooling apparatus 3, from an inlet in the bottom part of the housing 4 to an outlet in a roof 20 of the housing 4. Naturally the flow direction may be different in other implementations. The flow channels 32 are in thermal contact with the condenser 14 for receiving heat dissipated from the first fluid.

FIG. 4 is a simplified view of the cooling apparatus illustrating details of the cooling apparatus 3 with the housing 4 removed. In FIG. 4 the lower parts of the cooling apparatus 3 are not shown. However, these lower parts are implemented as illustrated in FIG. 2. The upper part of the cooling apparatus 3 as illustrated in FIG. 4 together with the lower part of the cooling apparatus as illustrated in FIG. 2 form a CLHP. As such a CLHP is orientation independent the illustrated apparatus can be installed and utilized in any orientation, even upside down with the condenser 14 at the bottom with respect to the working direction of the earth's gravity, and despite of this a sufficient circulation of the first fluid to achieve efficient cooling is obtained.

In FIG. 4 the base plate 10 does not extend all the way to the first end of the 7 evaporator 1 in order to more clearly illustrate the first end of the evaporator in this figure. However, in many implementations it is advantageous to utilize a base plate extending all the way to the first end of the evaporator 7. The base plate 10 may even extend beyond the first end 7 of the evaporator 1 such that it makes contact or almost makes contact with the inner surface of the roof 20.

Instead of providing a fluid path between the first end 7 of the evaporator 1 and the first end 21 of the condenser 14 via pipes, a chamber 22 is provided in the first end of the apparatus 3. In the illustrated example this chamber 22 which is delimited by the housing 4, the evaporator and the condenser is illustrated in FIG. 3 and the location of it is indicated in FIG. 4. This chamber 22 provides a fluid path between the first section 18 containing the evaporator 1 and the second section 19 containing the condenser. An advantage in using such a chamber 22 to provide a fluid path between the first end 7 of the evaporator 1 and the first end 21 of the condenser 14 is that pressure losses are minimized. The chamber 22 may easily be dimensioned to be sufficiently large, such that it provides a cross-sectional flow area which is of approximately the same size or larger than the combined cross-sectional flow area of the evaporator channels 6, for instance. The first end 21 of the condenser 14 is at the location where fluid can enter the condenser from the chamber 22.

In the illustrated embodiment, the condenser 14 is implemented to include a plurality of assemblies 24. Each assembly includes a pair of plates 25 with spacer elements 26 arranged along the edges of the plates 25 to keep the plates at a distance from each other. Consequently a first gap is provided between each pair of plates 25. This first gap which is limited by the plates 25 and the spacer elements 26 forms a condenser channel 23. In order to enhance the surface area coming into contact with the first fluid, offset strips 27, fins or any other condensation enhancement structure may be arranged in this first gap, as illustrated in FIG. 4. An advantage which may be obtained with the offset strips 27 or a similar structure is that these break down the liquid layer decreasing the condensation thermal resistance which is proportional to the liquid film thickness.

A second gap 31 in the first front end of each assembly 24 (by removal of a part of the space elements 26) allows first fluid from the first end 7 of the evaporator 1 to enter the condenser channels 23 provided as the first gaps between by the plates 25, the spacer elements 26 and the offset strips 27. Similarly a third gap 28 in the second front end of each assembly 24 by removal of a part of the spacer elements 26) allows the first fluid to exit the condenser channels 23 of the condenser 14 and to enter the compensation chamber 2.

The flow channels 32 are provided with fins 33 and extend through the condenser 14 for allowing the second fluid 36 to pass through the condenser 14. In the illustrated embodiment these flow channels 32 are located between the assemblies 24 which are separated from each other by spacer bars 30.

The illustrated cooling apparatus may be manufactured of a 3D printed evaporator, metal plates and bars which are cut into suitable dimensions and attached to each other by brazing, soldering or similar techniques, for instance. In praxis it is possible to mechanically connect the components of the cooling apparatus to each other during a single brazing step in an oven, for instance. Due to this the manufacturing costs of the apparatus can be kept low and the apparatus having superior thermal performance can be manufactured into desired dimensions to replace conventional heat sinks in existing electric cabinets.

FIGS. 5 to 8 illustrate dimensioning of the cooling apparatus illustrated in FIGS. 1 to 4.

In order to work efficiently enough capillary pressure must be generated to pump the first fluid through the evaporator, the first fluid must flow through the pores with as low friction pressure losses as possible and the evaporator must allow the heat to diffuse efficiently throughout the mass of the porous structure. In order to meet these requirements and obtain an efficient cooling apparatus, appropriate dimensioning of the evaporator is needed.

Figure 5:
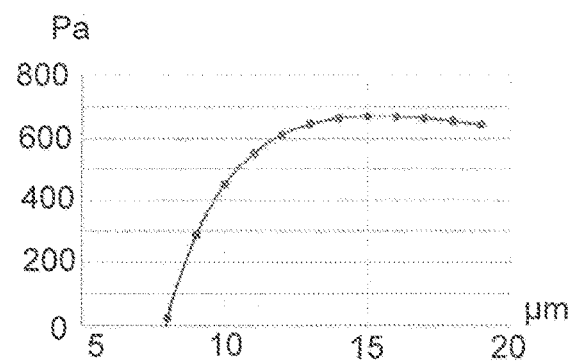
FIGS. 5 to 8 illustrate dimensioning of the cooling apparatus.
Figure 6:
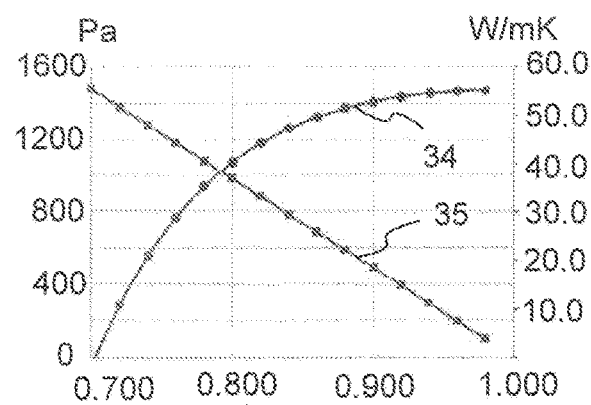
Figure 7:
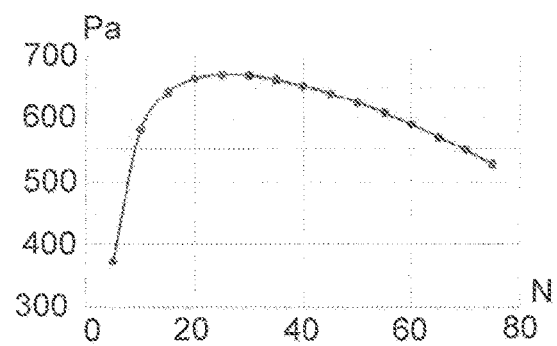
Figure 8:
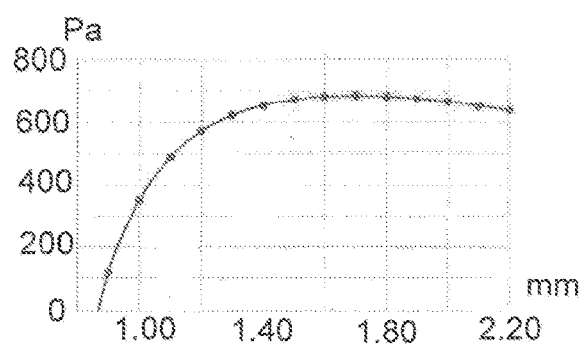

FIG. 5 illustrates the dependency between the pressure and the pore diameter. In FIG. 6 graph 34 illustrates the dependency between the porosity and the pressure while graph 35 illustrates the dependency between the porosity and the thermal conductivity. FIG. 7 illustrates the dependency between the number of channels N (the channels N are illustrated in FIG. 1) and the pressure. FIG. 8 illustrates the dependency between the channel diameter and the pressure.

For first fluids commonly used in cooling apparatuses for electric devices a suitable dimensioning of the evaporator is about 75% porosity, a pore size of about 15 µm, the number of channels N: 50 and a channel diameter of about 1.5 mm×1.5 mm. With such dimensions a suitable first fluid to use is R245fa (1,1,1,3,3-pentafluoropropane), for instance.

Figure 9:
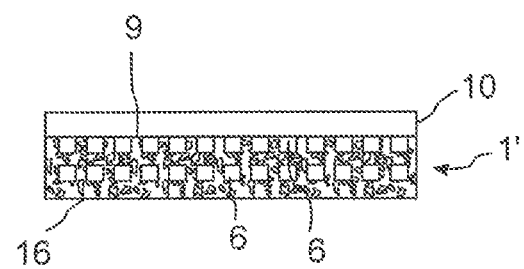
FIG. 9 illustrates an evaporator.

FIG. 9 illustrates an alternative embodiment of an evaporator. The embodiment of FIG. 9 is very similar to the one previously explained. Therefore the embodiment of FIG. 9 will be explained mainly by pointing out the differences to the previous embodiments.

In FIG. 9 illustrates an end view of the evaporator 1'and the base plate 10 attached to the first surface 9 of the evaporator 1'. From FIG. 9 it can be seen that the evaporator channels 6 opening up into the end surface of the evaporator 1' are arranged differently than in the previous embodiments. The uppermost layer of the evaporator channels 6 are arranged as grooves in the first surface 9 of the evaporator 1', while the lower layer of evaporator channels 6 is embedded at a location between the first surface 9 and the second surface 16. A consequence of this is that the contact area between the base plate 10 and the evaporator 9 is smaller than in the previous embodiment. This is cause by the fact that the grooves in the upper surface 9 reduces the contact area and consequently also reduces thermal conduction of heat from the base plate to the evaporator.

It is to be understood that the above description and the accompanying figures are only intended to illustrate the present invention. It will be obvious to a person skilled in the art that the invention can be varied and modified without departing from the scope of the invention.

The invention claimed is:

1. A cooling apparatus comprising:
a base plate for receiving a heat load from one or more electric components,
an evaporator with a first surface in thermal contact with a surface of the base plate for transferring said heat load into a first fluid in the evaporator in an operating state of the cooling apparatus, wherein the evaporator comprises a porous structure having capillary pores,
a condenser for receiving the first fluid from a first end of the evaporator and for dissipating heat from the first fluid,
a compensation chamber extending along a second surface of the evaporator, the compensation chamber receiving the first fluid from the condenser such that pores opening up into the second surface of the evaporator are provided with the first fluid, and
a chamber in fluid communication with the first end of the evaporator and with a first end of the condenser for passing the first fluid from the evaporator to the condenser, the chamber being delimited by a housing, the evaporator and the condenser,
wherein the cooling apparatus is a capillary loop heat pipe,
wherein the first surface and the second surface of the evaporator are substantially flat and opposite from each other,
wherein the porous structure of the evaporator is a porous aluminum structure having the capillary pores and evaporator channels extending through the evaporator between a second end and the first end of the evaporator, the evaporator channels being larger in cross-sectional size than the capillary pores,
wherein the evaporator channels are embedded in the evaporator at a location between the first surface and the second surface and arranged at different depths between the first surface and the second surface, such that each of the different depths includes a plurality of evaporator channels, and
wherein a cross-sectional flow area of the chamber is of a similar size or larger than a combined cross-sectional flow area of all the evaporator channels.

2. The cooling apparatus according to claim 1, wherein the apparatus comprises a flow channel for a second fluid which is in thermal contact with the condenser for receiving heat dissipated from the first fluid.

3. The cooling apparatus according to claim 2, wherein the second fluid is air and the flow channel is provided with fins for dissipating heat into air flowing through the flow channel.

4. The cooling apparatus according to claim 1, wherein the condenser is provided with assemblies comprising a pair of plates with spacer elements separating the plates from each other in order to provide condenser channels which are limited by the plates and the spacer elements.

5. The cooling apparatus according to claim 1, wherein the size of the pores is 1 to 100 µm and a width of the evaporator channels is 0.5 to 5 mm.

6. The cooling apparatus according to claim 1, wherein the size of the pores varies between the first end of the evaporator and the second end of the evaporator.

7. The cooling apparatus according to claim 6, wherein the size of the pores proximate to the first end is smaller than the size of the pores proximate to the second end.

8. The cooling apparatus according to claim 6, wherein the size of the pores proximate to the first end is larger than the size of the pores proximate to the second end.

9. The cooling apparatus according to claim 1, which further comprises a power module comprising one or more electric components thermally connected to the base plate.

10. The cooling apparatus according to claim 1, wherein the evaporator is a monolithic porous structure between the first surface and the second surface.

11. A method for manufacturing a cooling apparatus, the method comprises:
producing an evaporator having a capillary porous structure with pores and a plurality of evaporator channels, the evaporator channels being larger in cross-sectional size than the pores, the evaporator channels being embedded in the evaporator at a location between a first surface and a second surface of the evaporator, the first surface and the second surface being substantially flat and opposite from each other, the evaporator channels being arranged at different depths between the first surface and the second surface, such that each of the different depths includes a plurality of evaporator channels extending through the evaporator between a second end and a first end of the evaporator by utilizing a 3D printer, providing a compensation chamber to extend along a second surface of the evaporator for supplying a first fluid to the evaporator via the pores opening up into the second surface, providing fluid paths from said evaporator and said compensation chamber to a first end and respectively second end of a condenser for passing the first fluid evaporated from the evaporator to the condenser and for passing the first fluid condensed from the condenser to the compensation chamber in an operating state of the cooling apparatus, and providing a chamber in fluid communication with the first end of the evaporator and with a first end of the condenser for passing the first fluid from the evaporator to the condenser, a cross-sectional flow area of the chamber being of similar size or larger than the combined cross-sectional flow area of all the evaporator channels, and said chamber is delimited by a housing, the evaporator and the condenser.

12. The method according to claim 11, wherein the components of the cooling apparatus are mechanically connected to each other during a single brazing step.

13. The method according to claim 11, wherein the evaporator is a monolithic porous structure between the first surface and the second surface.

* * * * *